United States Patent
Shono et al.

[11] Patent Number: 6,044,099
[45] Date of Patent: Mar. 28, 2000

[54] SEMICONDUCTOR LASER DEVICE

[75] Inventors: Masayuki Shono; Ryoji Hiroyama, both of Hirakata; Kouji Komeda, Ogaki; Toyozo Nishida, Hirakata; Yasuyuki Bessho, Uji, all of Japan

[73] Assignee: Sanyo Electric Co., Ltd., Moriguchi, Japan

[21] Appl. No.: 08/924,826

[22] Filed: Sep. 5, 1997

[30]   Foreign Application Priority Data

Sep. 6, 1996 [JP] Japan .................................. 8-236798

[51] Int. Cl.⁷ .................................................. H01S 3/085
[52] U.S. Cl. .................................................. 372/46
[58] Field of Search .............................. 372/49, 45, 46; 257/94; 357/17; 438/33

[56]           References Cited

U.S. PATENT DOCUMENTS

| | | | |
|---|---|---|---|
| 5,020,068 | 5/1991 | Isshiki | 372/46 |
| 5,045,500 | 9/1991 | Mitsui et al. | 438/33 |
| 5,559,818 | 9/1996 | Shono et al. | 372/45 |
| 5,600,667 | 2/1997 | Kidoguchi et al. | 372/45 |
| 5,666,375 | 9/1997 | Yokouchi et al. | 372/45 |

FOREIGN PATENT DOCUMENTS 2-148786  6/1990  Japan .
2-224288  9/1990  Japan .

OTHER PUBLICATIONS

SPIE–The International Society for Optical Engineering; vol. 1219, pp. 126–133; Jan. 16–19, 1990, Los Angeles, CA.

CLEO '91, pp. 94–97—May 14, 1991.

Electronics Letters, vol. 27, No. 8, pp. 661–662, Apr. 11, 1991.

Electronics Letters, vol. 27, No. 19, pp. 1713–1714, Sep. 12, 1991.

Electronics Letters, vol. 29, No. 4, pp. 369–370, Feb. 18, 1993.

*Primary Examiner*—James W. Davie
*Attorney, Agent, or Firm*—Armstrong, Westerman, Hattori, McLeland, & Naughton

[57]           ABSTRACT

A semiconductor laser device comprises an n-type cladding layer, an active layer formed on the n-type cladding layer and having a quantum well structure including one or a plurality of quantum well layers, a p-type cladding layer comprising a flat portion formed on the active layer and a stripe-shaped ridge portion on the flat portion, and a current blocking layer formed on the flat portion so as to cover the side surface of the ridge portion and formed on a region on the upper surface of the ridge portion from one of facets of a cavity to a position at a predetermined distance therefrom.

47 Claims, 12 Drawing Sheets

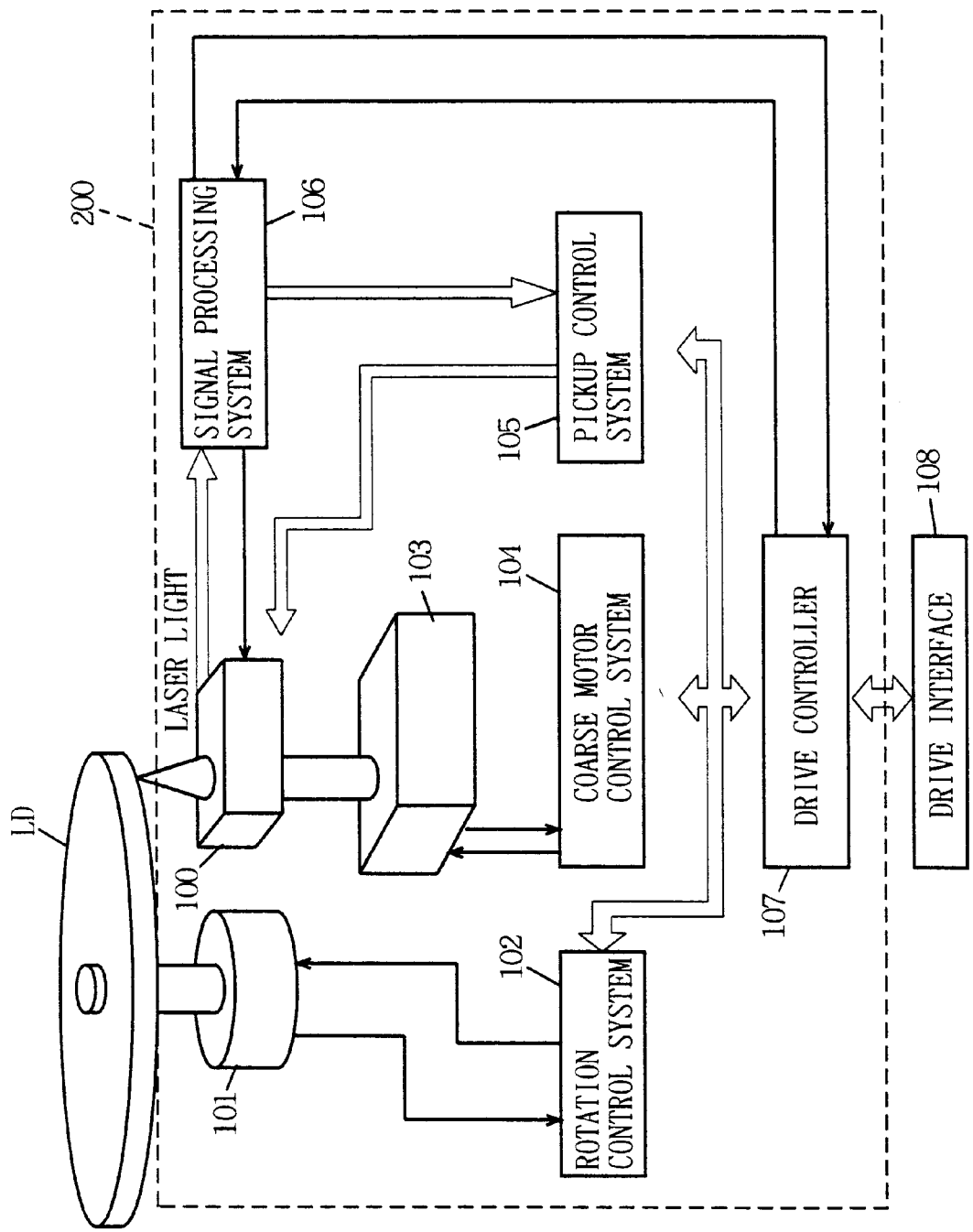

SEMICONDUCTOR LASER DEVICE

BACKGROUND OF THE INVENTION

1. Field of the Invention

The present invention relates generally to semiconductor laser devices, and more particularly, to a semiconductor laser device comprising an active layer having a quantum well structure and an optical recording medium drive using the same.

2. Description of the Background Art

An AlGaInP system semiconductor laser device has been actively studied and developed as a semiconductor laser device having a lasing wavelength in a red band. The AlGaInP system semiconductor laser device can carry out lasing in a band of 630 to 680 nm, and the wavelength band is high in spectral luminous efficacy. Therefore, the semiconductor laser device is used for a laser pointer, a line marker, and the like. The semiconductor laser device has a shorter lasing wavelength than an AlGaAs system semiconductor laser device, whereby it is expected as a light source for high-density recording, for example, and is scheduled to be employed as a light source of a digital video disc (DVD) currently proposed.

In such a semiconductor laser device, the inventors of the present application have found that the maximum light output power can be improved to approximately 40 mW by employing a strain compensation type multi quantum well structure for an active layer.

When the semiconductor laser device is used as a light source for a reloadable optical recording medium, however, it is desired to lengthen the life of the semiconductor laser device while increasing the maximum light output power.

SUMMARY OF THE INVENTION

An object of the present invention is to provide a semiconductor laser device producing high maximum light output power and having a long life.

Another object of the present invention is to provide an optical recording medium drive comprising a semiconductor laser device producing high maximum light output power and having a long life.

A semiconductor laser device according to the present invention comprises a cladding layer of a first conductivity type, an active layer having a quantum well structure including one or a plurality of quantum well layers, and a cladding layer of a second conductivity type opposite to the first conductivity type in this order, the cladding layer of the first conductivity type, the active layer, and the cladding layer of the second conductivity type constituting a cavity, further comprising a current injection blocking structure for blocking the injection of current into a region, on the side of at least one of facets of the cavity, of the active layer.

The semiconductor laser device has the current injection blocking structure in the vicinity of at least one of the facets of the cavity. The current injection blocking structure can block the injection of the current into the active layer in the vicinity of the facet of the cavity, whereby heat generation at the facet outputting main laser light can be restrained, so that high output power can be achieved.

The active layer is substantially a saturable light absorbing member. Consequently, the active layer in a current injection blocking region caused by employing the current injection blocking structure is a loss region before lasing, while being a gain region during lasing. In the semiconductor laser device according to the present invention, the active layer has a quantum well structure, and only the quantum well layer or layers in the quantum well structure will be the saturable light absorbing member, so that the volume of the saturable light absorbing member is decreased. Therefore, lasing threshold current can be prevented from being increased, and the life of the semiconductor laser device can be lengthened.

As a result, in the semiconductor laser device according to the present invention, the threshold current can be decreased while increasing the maximum light output power, and the life of the semiconductor laser device can be lengthened.

The current injection blocking structure may comprise a current blocking layer formed on the cladding layer of the second conductivity type and having a stripe-shaped opening for injecting current. The stripe-shaped opening may be arranged along the cavity length direction from a position at a predetermined distance from at least one of the facets of the cavity.

In this case, a current injection blocking structure (a current blocking layer) for blocking the injection of current into the active layer is provided on the side of at least one of the facets of the cavity by the current blocking layer having the stripe-shaped opening arranged along the cavity length direction from the position at the predetermined distance from at least one of the facets of the cavity for injecting current. Consequently, the threshold current can be decreased while increasing the maximum light output power, and the life of the semiconductor laser device can be lengthened.

The cladding layer of the second conductivity type may comprise a flat portion formed on the active layer and a stripe-shaped ridge portion on the flat portion, and the current blocking layer may be formed on the flat portion so as to cover the side surface of the ridge portion and formed on a region on the upper surface of the ridge portion from at least one of the facets of the cavity to the position at the predetermined distance therefrom.

In this case, a current injection blocking structure for blocking the injection of current into the quantum well structure of the active layer is provided on the side of one of the facets of the cavity by the current blocking layer formed on the flat portion so as to cover the side surface of the ridge portion and formed on the region on the upper surface of the ridge portion from one of the facets of the cavity to the position at the predetermined distance therefrom, and a region, where there is provided no current blocking layer, on the upper surface of the ridge portion will be a current injection region. Consequently, the threshold current can be decreased while increasing the maximum light output power, and the life of the semiconductor laser device can be lengthened.

It is preferable that the total volume of the quantum well layer or layers directly below the stripe-shaped ridge portion is not more than approximately $1 \times 10^{-16} m^3$. Consequently, the characteristics of the threshold current and the maximum light output power are good.

It is more preferable that the total volume of the quantum well layer or layers directly below the stripe-shaped ridge portion is not more than approximately $9 \times 10^{-17} m^3$. Consequently, the characteristics of the threshold current and the maximum light output power are improved.

It is still more preferable that the total volume of the quantum well layer or layers directly below the stripe-shaped ridge portion is not more than approximately $8 \times 10^{17} m^3$. Consequently, the characteristics of the threshold current and the maximum light output power are further improved.

It is preferable that the total volume of the quantum well layer or layers directly below the stripe-shaped ridge portion is not less than approximately $4 \times 10^{-17} m^3$. Consequently, the characteristics of the threshold current and the maximum light output are good.

It is more preferable that the total volume of the quantum well layer or layers directly below the stripe-shaped ridge portion is not less than approximately $4.5 \times 10^{-17} m^3$. Consequently, the characteristics of the threshold current and the maximum light output power are improved.

It is still more preferable that the total volume of the quantum well layer or layers directly below the stripe-shaped ridge portion is not less than approximately $6 \times 10^{-17} m^3$. Consequently, the characteristics of the threshold current and the maximum light output power are further improved.

Specifically, the total volume of the quantum well layer or layers directly below the ridge portion is preferably not less than approximately $4 \times 10^{-17} m^3$ nor more than approximately $1 \times 10^{-16} m^3$, more preferably not less than $4.5 \times 10^{-17} m^3$ nor more than approximately $9 \times 10^{-17} m^3$, and still more preferably not less than approximately $6 \times 10^{-17} m^3$ nor more than approximately $8 \times 10^{-17} m^3$.

It is preferable that the predetermined distance from at least one of the facets of the cavity is not less than approximately 10 $\mu$m nor more than approximately 40 $\mu$m. Consequently, the characteristics of the threshold current and the maximum light output power are improved.

It is more preferable that the predetermined distance from at least one of the facets of the cavity is not less than approximately 20 $\mu$m nor more than approximately 30 $\mu$m. Consequently, the characteristics of the threshold current and the maximum light output power are further improved.

It is preferable that the semiconductor laser device is m composed of an AlGaInP system semiconductor in terms of a short wavelength. In the case of the AlGaInP semiconductor laser device, the cladding layers of the first and second conductivity types may be composed of $(Al_{x1}Ga_{1-x1})_{y1}In_{1-y1}P$, and the quantum well layer may be composed of $(Al_pGa_{1-p})_qIn_{1-q}P$, where $1 \geq x1 > 0$, $1 > y1 > 0$, $x1 > p \geq 0$, and $1 > q > 0$. It is preferable that the structures are formed on a GaAs semiconductor substrate of the first conductivity type.

The quantum well structure may be a multi quantum well structure constructed by alternately stacking a plurality of quantum well layers and a plurality of barrier layers. Particularly, it is preferable that the plurality of quantum well layers in the multi quantum well structure have tensile strain, and the plurality of barrier layers therein have compressive strain. In this case, the threshold current can be decreased and the maximum light output power can be increased while achieving a short wavelength, and the life of the semiconductor laser device can be lengthened.

In the case of the AlGaInP system semiconductor laser device, the plurality of quantum well layers may be composed of $(Al_pGa_{1-p})_qIn_{1-q}P$, and the plurality of barrier layers may be composed of $(Al_rGa_{1-r})_sIn_{1-s}P$, where $x1 > p \geq 0$, $1 > q > 0$, $1 \geq r > p > 0$, and $1 > s > 0$.

The quantum well structure may be a single quantum well m structure. In this case, the volume of the saturable light absorbing member in the active layer can be decreased, whereby the threshold current can be significantly prevented from being increased. Particularly, the quantum well layer in the single quantum well structure may have tensile strain. In this case, a shorter wavelength can be achieved.

In the case of the AlGaInP system semiconductor laser device, the quantum well layer in the single quantum well structure may be composed of $(Al_pGa_{1-p})_qIn_{1-q}P$, where $x1 > p \geq 0$ and $1 > q > 0$.

The active layer may further comprise optical guide layers provided on both surfaces of the quantum well structure. The quantum well layer may have tensile strain, and at least a region, on the side of the quantum well structure, of each of the optical guide layers may have compressive strain. In this case, the strain of the active layer can be sufficiently compensated for, whereby the life of the semiconductor laser device can be lengthened. Moreover, a short wavelength can be achieved.

In the case of the AlGaInP system semiconductor laser device, the optical guide layers may be composed of $(Al_{x2}Ga_{1-x2})_{y2}In_{1-y2}P$, where $x1 > x2 > 0$, and $1 > y2 > 0$.

The current injection blocking structure may be provided in the vicinity of both facets of the cavity. In the case of the AlGaInP system semiconductor laser device or an AlGaAs system semiconductor laser device, a GaAs layer of the first conductivity type may be used as the current blocking layer. The cladding layers of the first and second conductivity types may have different compositions. The optical guide layers on both surfaces of the quantum well layer may have different compositions.

An optical recording medium drive according to another aspect of the present invention comprises a rotation driving portion for rotating an optical recording medium, an optical pickup comprising a semiconductor laser device and a photo detector for irradiating laser light emitted from the semiconductor laser device onto the optical recording medium and receiving returned light from the optical recording medium by the photo detector, a pickup driving portion for moving the optical pickup along the radius of the optical recording medium, and a signal processing portion for processing an output signal from the photo detector in the optical pickup, the semiconductor laser device comprising a cladding layer of a first conductivity type, an active layer comprising a quantum well structure including one or a plurality of quantum well layers, and a cladding layer of a second conductivity type opposite to the first conductivity type in this order, the cladding layer of the first conductivity type, the active layer, and the cladding layer of the second conductivity type constituting a cavity, further comprising a current injection blocking structure for blocking the injection of current into a region, on the side of at least one of facets of the cavity, of the active layer.

The current injection blocking structure may comprise a current blocking layer formed on the cladding layer of the second conductivity type and having a stripe-shaped opening for injecting current. The stripe-shaped opening may be arranged along the cavity length direction from a position at a predetermined distance from at least one of the facets of the cavity.

The cladding layer of the second conductivity type may comprise a flat portion formed on the active layer and a stripe-shaped ridge portion on the flat portion, and the current blocking layer may be formed on the flat portion so as to cover the side surface of the ridge portion and formed on a region on the upper surface of the ridge portion from at least one of the facets of the cavity to the position at the predetermined distance therefrom.

It is preferable that the semiconductor laser device is composed of an AlGaInP system semiconductor in terms of a short wavelength. In the case of the AlGaInP semiconductor laser device, the cladding layers of the first and second conductivity types may be composed of $(Al_{x1}Ga_{1-x1})_{y1}In_{1-y1}P$, and the quantum well layer may be composed of $(Al_pGa_{1-p})_qIn_{1-q}P$, where $1 \geq x1 > 0$, $1 > y1 > 0$, $x1 > p \geq 0$, and $1 > q > 0$. It is preferable that the structures are formed on a GaAs semiconductor substrate of the first conductivity type.

The quantum well structure may be a multi quantum well structure constructed by alternately stacking a plurality of quantum well layers and a plurality of barrier layers. Particularly, it is preferable that the plurality of quantum well layers in the multi quantum well structure have tensile strain, and the plurality of barrier layers therein have compressive strain.

The quantum well structure may be a single quantum well structure. Particularly, the quantum well layer in the single quantum well structure may have tensile strain.

The active layer may further comprise optical guide layers provided on both surfaces of the quantum well structure. The quantum well layer may have tensile strain, and at least a region, on the side of the quantum well structure, of each of the optical guide layers may have compressive strain.

The foregoing and other objects, features, aspects and advantages of the present invention will become more apparent from the following detailed description of the present invention when taken in conjunction when the accompanying drawing.

BRIEF DESCRIPTION OF THE DRAWINGS

FIG. 16 is a block diagram showing the construction of an optical recording medium drive using the optical pickup shown in FIG. 15.

DESCRIPTION OF THE PREFERRED EMBODIMENTS

Figure 1:
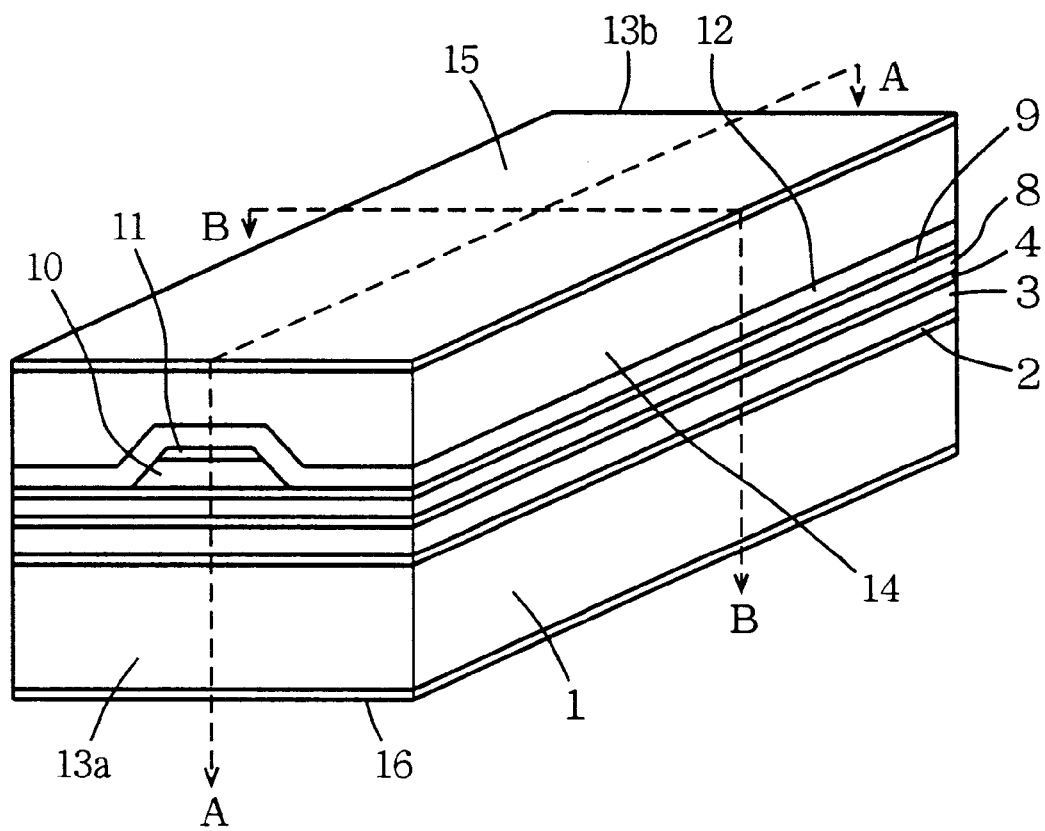
FIG. 1 is a schematic perspective view of a semiconductor laser device according to a first embodiment of the present invention.

An AlGaInP system semiconductor laser device according to a first embodiment of the present invention will be described with reference to the drawings. FIG. 1 is a schematic perspective view of the semiconductor laser device according to the first embodiment, FIG. 2 is a schematic cross-sectional view taken along a broken line A—A in FIG. 1, FIG. 3 is a schematic cross-sectional view taken along a broken line B—B in FIGS. 1 and 2, and FIG. 4 is a diagram showing a schematic band structure on the side of a conduction band in the vicinity of an active layer of the semiconductor laser device shown in FIG. 1.

Figure 2:
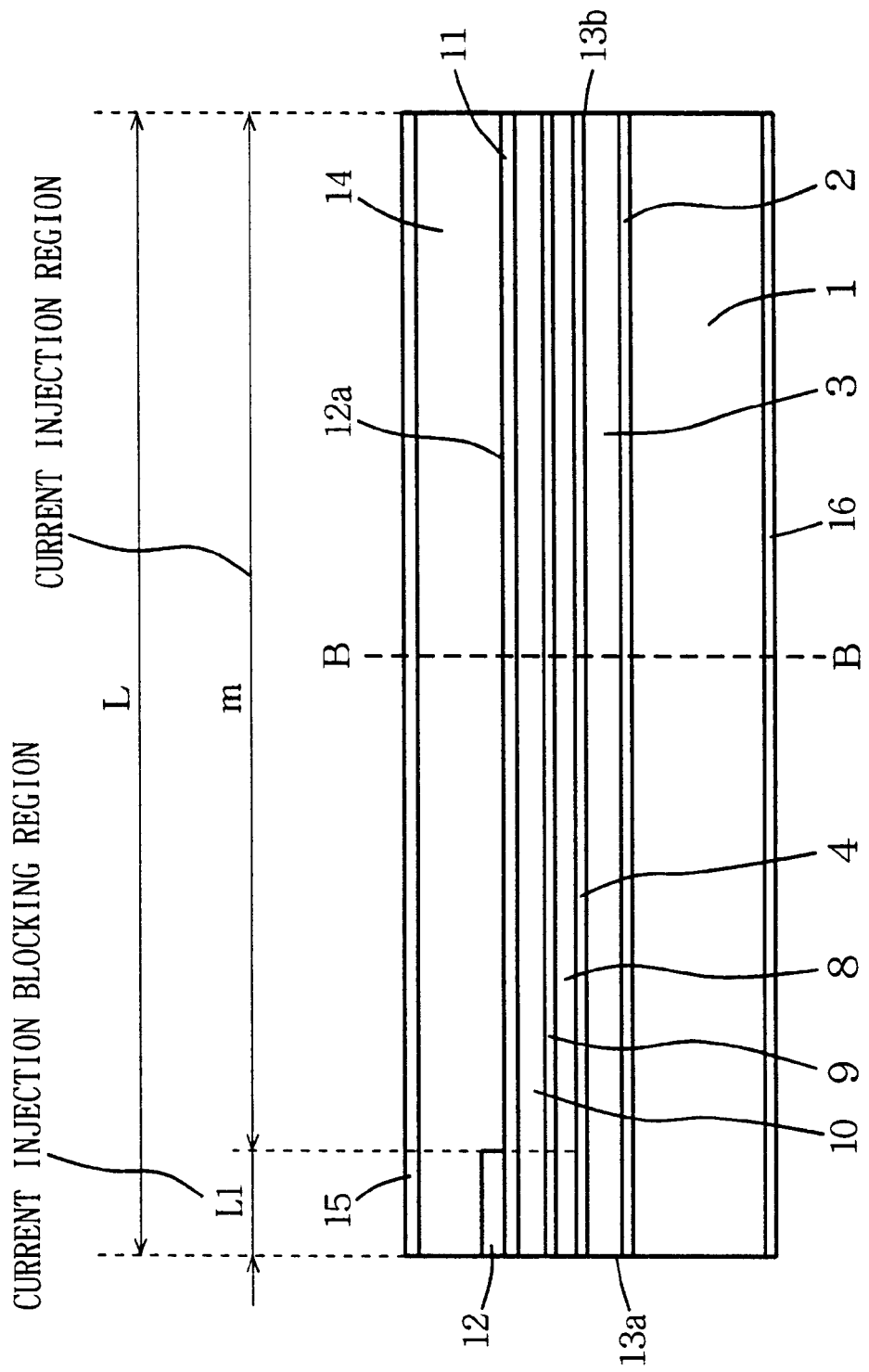
FIG. 2 is a schematic cross-sectional view taken along a line A—A of the semiconductor laser device according to the first embodiment.
Figure 3:
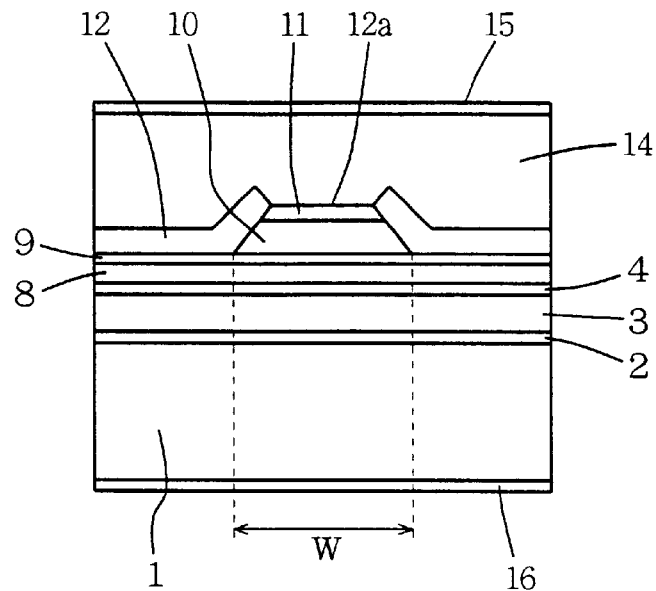
FIG. 3 is a schematic cross-sectional view taken along a line B—B of the semiconductor laser device according to the first embodiment.
Figure 4:
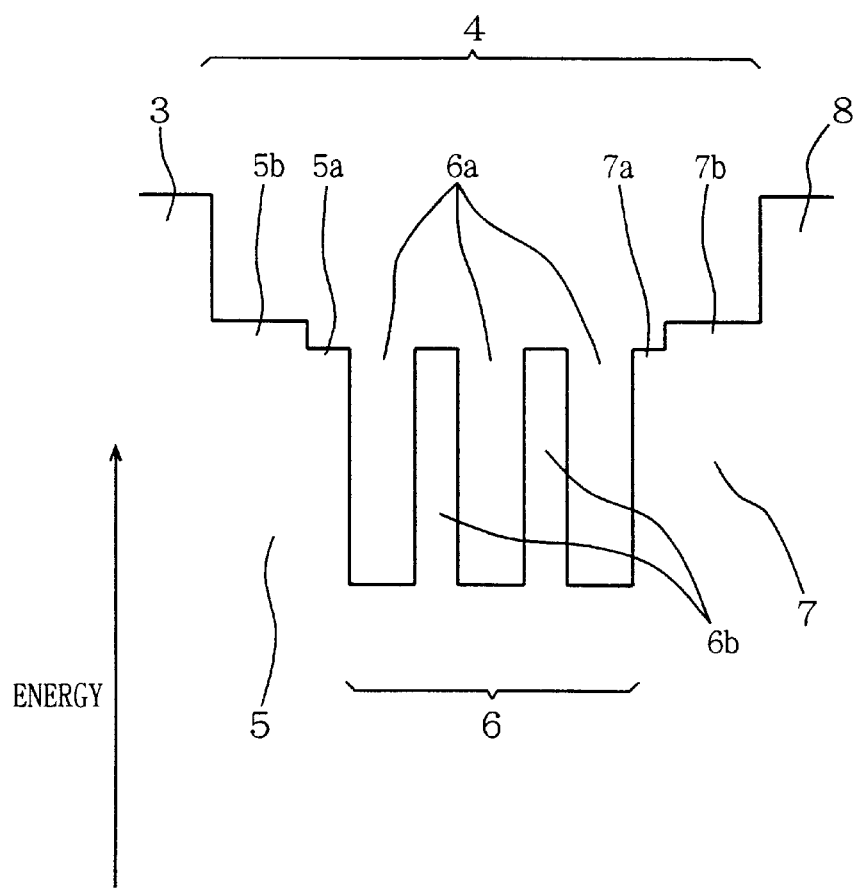
FIG. 4 is a diagram showing a schematic band structure in the vicinity of an active layer of the semiconductor laser device according to the first embodiment.

In FIGS. 1 to 3, an n-type GaAs semiconductor substrate 1 has one main surface (crystal growth plane) misoriented at an angle θ from the (100) plane to the [011] direction. The angle θ is preferably 5 to 17°, and more preferably 7 to 13°, which is 13° in the present embodiment. A buffer layer 2 composed of n-type $Ga_{0.5}In_{0.5}P$ having a thickness of 0.3 μm is formed on the one main surface of the n-type GaAs semiconductor substrate 1.

A cladding layer 3 composed of n-type $(Al_{x1}Ga_{1-x1})_{y1}In_{1-y1}P$ having a thickness of 1.5 μm is formed on the buffer layer 2. In the present embodiment, x1=0.7 and y1=0.5. An undoped active layer 4 is formed on the cladding layer 3. As shown in detail in FIG. 4, the active layer 4 has a structure in which an optical guide layer 5, a multi quantum well structure 6 and an optical guide layer 7 are stacked in this order.

The optical guide layer 5 is composed of undoped $(Al_{x2}Ga_{1-x2})_{y2}In_{1-y2}P$ having a thickness of 500 Å. In the present embodiment, x2=0.5. In the optical guide layer 5, y2=0.44 is selected in a region 5a having a thickness of 40 Å on the side of the multi quantum well structure 6 in close contact with the structure 6, whereby the region 5a has compressive strain. On the other hand, in the optical guide layer 5, y2=0.5 is selected in a region 5b having a thickness of 460 Å on the side of the n-type cladding layer 3, whereby the region 5b has no strain.

The multi quantum well structure 6 has a strain compensation type multi quantum well structure constructed by alternately stacking quantum well layers 6a composed of $(Al_pGa_{1-p})_qIn_{1-q}P$ having a thickness of 110 Å which have tensile strain and quantum barrier layers 6b composed of $(Al_rGa_{1-r})_sIn_{1-s}P$ having a thickness of 40 Å which have compressive strain, where $1 > p \geq 0$ and $1 > q > 0.51$, and $1 \geq r > 0$ and $0 < s < 0.51$. In the present embodiment, p=0 and q=0.64, and r=0.5 and s=0.44.

The optical guide layer 7 is composed of undoped $(Al_{x2}Ga_{1-x2})_{y2}In_{1-y2}P$ having a thickness of 500 Å. In the present embodiment, x2=0.5. In the optical guide layer 7, y2=0.44 is selected in a region 7a having a thickness of 40 Å on the side of the quantum well structure 6 in close contact with the structure 6, whereby the region 7a has compressive strain. On the other hand, in the optical guide layer 7, y2=0.5 is selected in a region 7b having a thickness of 460 Å on the side of a p-type cladding layer 8 as described later, whereby the region 7b has no strain.

A flat portion 8 composed of p-type $(Al_{x1}Ga_{1-x1})_{y1}In_{1-y1}P$ having a thickness of 0.3 µm and constituting a p-type cladding layer is formed on the optical guide layer 7. An etching stop layer 9 composed of p-type $Ga_{0.5}In_{0.5}P$ having a thickness of 20 Å is formed on the flat portion 8.

A stripe-shaped ridge portion 10 composed of p-type $(Al_{x1}Ga_{1-x1})_{y1}In_{1-y1}P$ having a width of W5 µm on its lower surface and having a thickness of 1.2 µm which extends along the cavity length direction and constituting a p-type cladding layer is formed on the p-type etching stop layer 9. In the present embodiment, x1=0.7 and y1=0.5. A contact layer 11 composed of p-type $Ga_{0.5}In_{0.5}P$ having a thickness of 0.1 µm is formed on the upper surface of the ridge portion 10.

A current blocking layer 12 composed of n-type GaAs having a thickness of 0.8 µm is formed on the upper surface of the etching stop layer 9 so as to cover the side surface of the ridge portion 10 and the side surface of the contact layer 11, and is formed on a region on the upper surface of the contact layer 11 from one facet 13a, which outputs main laser light, of a cavity to a position at a predetermined distance L1 therefrom. In the present embodiment, L1=20 µm. Consequently, the n-type current blocking layer 12 has an opening 12a forming a current path on a region on the upper surface of the contact layer 11 at a distance m from the above-mentioned position at the predetermined distance L1 to the other facet 13b of the cavity, that is, on the upper surface of the ridge portion 10, as shown in FIG. 2.

A cap layer 14 composed of p-type GaAs having a thickness of 3 µm is formed on the current blocking layer 12 and the contact layer 11 in the opening 12a.

A p-side ohmic electrode 15 composed of Au—Cr is formed on the upper surface of the cap layer 14, and an n-side ohmic electrode 16 composed of Au—Sn—Cr is formed on the lower surface of the n-type GaAs semiconductor substrate 1.

In the semiconductor laser device, the current blocking layer 12 is formed on the region on the upper surface of the ridge portion 10 from the facet 13a outputting main laser light to the position at the predetermined distance L1 therefrom. Accordingly, a region of the active layer 4 below the current blocking layer 12 is a current injection blocking region into which current is blocked from being injected. The current blocking layer 12 is not formed on the region on the upper surface of the ridge portion 10 at a distance m from the above-mentioned position at the predetermined distance L1 to the other facet 13b. Accordingly, the active layer 4 below the region is a current injection region into which current is sufficiently injected. That is, the semiconductor laser device has a current injection blocking structure on the side of one of the facets of the cavity.

In the present embodiment, the total volume of the quantum well layers 6a having a width W directly below the stripe-shaped ridge portion 10 is $9.9 \times 10^{-17}$ m$^3$.

Figure 5:
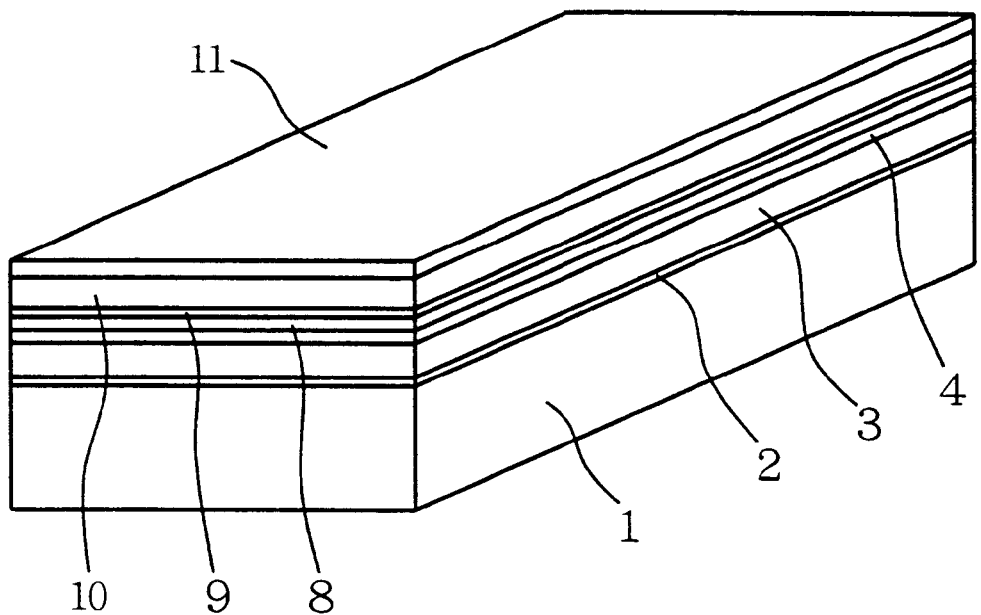
FIG. 5 is a diagram showing the first step of fabricating the semiconductor laser device according to the first embodiment.

The steps of fabricating the semiconductor laser device will be described using the drawings. As shown in FIG. 5, an n-type buffer layer 2, an n-type cladding layer 3, an undoped active layer 4, a p-type cladding layer 8, a p-type etching stop layer 9, a p-type cladding layer 10, and a p-type contact layer 11 are continuously grown in this order on an n-type GaAs semiconductor substrate 1 by MOCVD (Metal Organic Chemical Vapor Deposition).

Figure 6:
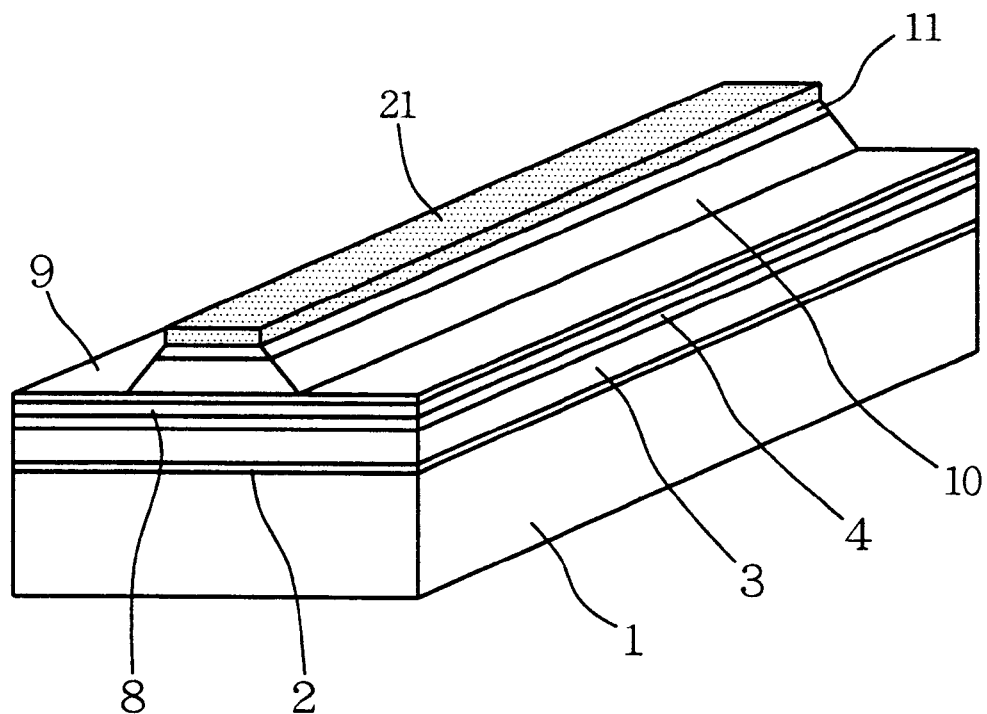
FIG. 6 is a diagram showing the second step of fabricating the semiconductor laser device according to the first embodiment.

As shown in FIG. 6, an $SiO_2$ film having a thickness of 0.2 µm is then formed on the p-type contact layer 11 by electron beam evaporation, and the $SiO_2$ film is patterned by a photolithographic technique and etching using a fluorine etchant, to produce a stripe-shaped mask 21. Thereafter, a region from the p-type contact layer 11 to the p-type etching stop layer 9 is subjected to wet etching with the mask 21 being used, to form the p-type cladding layer 10 in the shape of a stripe-shaped ridge portion.

Figure 7:
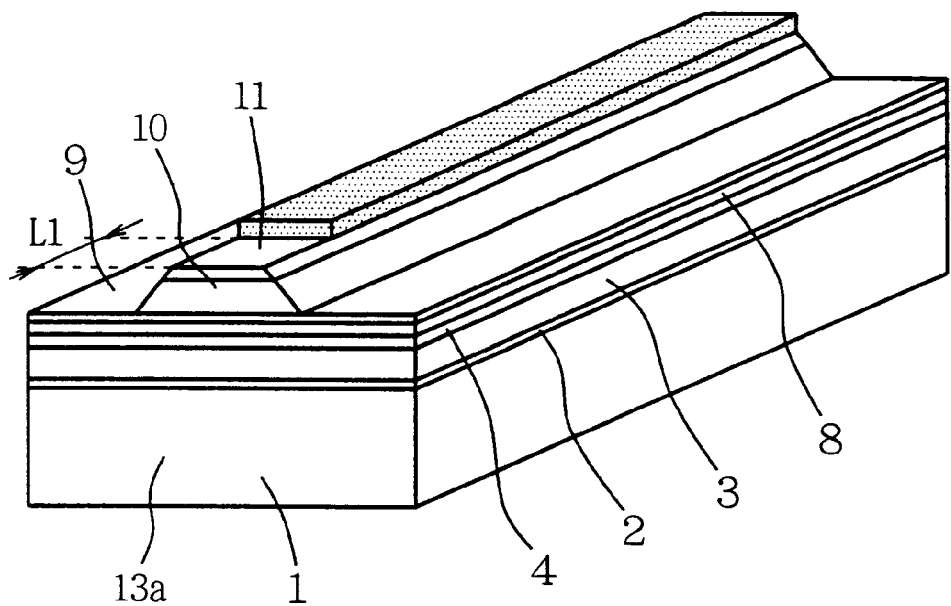
FIG. 7 is a diagram showing the third step of fabricating the semiconductor laser device according to the first embodiment.

Thereafter, the mask 21 from a facet 13a to a position at a predetermined distance L1 therefrom is etched away by a photolithographic technique and etching using a fluorine etchant, as shown in FIG. 7.

Figure 8:
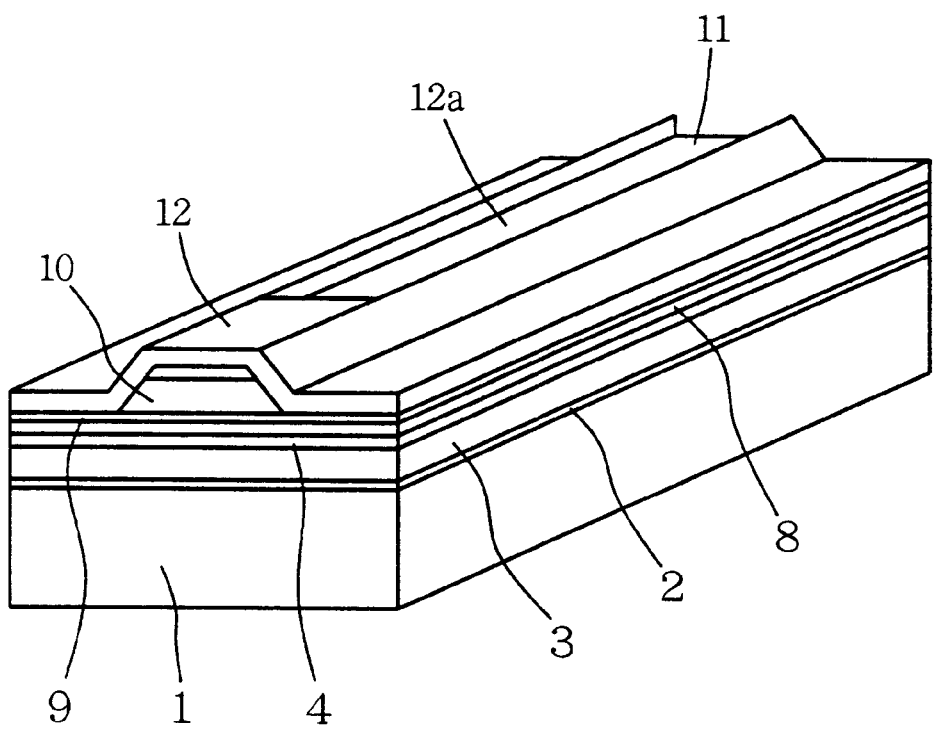
FIG. 8 is a diagram showing the fourth step of fabricating the semiconductor laser device according to the first embodiment.

As shown in FIG. 8, an n-type current blocking layer 12 is then formed by MOCVD with the mask 21 whose portion on the side of the facet 13a is removed being used, after which the mask 21 is etched away by a fluorine etchant.

A p-type cap layer 14 is then formed by MOCVD, after which a p-side ohmic electrode 15 and an n-side ohmic electrode 16 are formed, to complete the semiconductor laser device shown in FIG. 1.

The following Table 1 shows a threshold current and maximum light output power in each of the semiconductor laser devices in the present embodiment, a comparative example 1, a comparative example 2 and a comparative example 3. The semiconductor laser device in the comparative example 1 is constructed similarly to the semiconductor laser device in the embodiment except that an active layer 4 composed of an undoped $(Al_{0.15}Ga_{0.85})_{0.5}In_{0.5}P$ layer having a thickness of 800 Å which has no quantum well structure, and there is provided no facet vicinity current injection blocking structure. The semiconductor laser device in the comparative example 2 is constructed similarly to the semiconductor laser device in the comparative example 1 except that the above-mentioned facet vicinity current injection blocking layer is provided. The semiconductor laser device in the comparative example 3 is constructed similarly to the semiconductor laser device in the embodiment except that the above-mentioned facet vicinity current injection blocking structure is not provided.

The cavity length L is 600 µm. A coating having reflectivity of 5% is applied to the facet 13a of the cavity, and a coating having reflectivity of 95% is applied to the facet 13b of the cavity.

TABLE 1

|  | threshold current (mA) | maximum light output power (mw) |
| --- | --- | --- |
| embodiment | 48 ~ 52 | ~45 |
| comparative example 1 | 95 ~ 103 | ~15 |
| comparative example 2 | 111 ~ 120 | ~35 |
| comparative example 3 | 45 ~ 52 | ~40 |

As can be seen from Table 1, in the semiconductor laser device in the comparative example 3 comprising an active layer having a multi quantum well structure, the maximum light output power can be increased, and the threshold current can be decreased, as compared with those in the semiconductor laser device in the comparative example 1 comprising an active layer having no quantum well structure. That is, the formation of the active layer in the quantum well structure is effective in increasing the maximum light output power and decreasing the threshold current.

On the other hand, as can be seen from comparison between the comparative example 1 and the comparative example 2, it is considered that the introduction of the facet vicinity current injection blocking structure increases the threshold current. In the present embodiment, however, it is found that the threshold current is hardly increased, and the maximum light output power can be increased, as compared with those in the semiconductor laser device in the comparative example 3 comprising an active layer having a quantum well structure in which no facet vicinity current injection blocking layer is provided. Moreover, the semiconductor laser device in the present embodiment has a longer life than the semiconductor laser device in the comparative example 3.

Specifically, in the semiconductor laser device according to the present embodiment, the current injection blocking structure for blocking the injection of current into the active layer 4 is provided in the vicinity of the facet 13a outputting main laser light, and the active layer 4 has the strain compensation type quantum well structure 6 constructed by alternately stacking quantum well layers 6a having tensile strain and quantum barrier layers 6b having compressive strain. Therefore, the maximum light output power can be increased while decreasing the threshold current, and the life of the semiconductor laser device is long.

Figure 9:
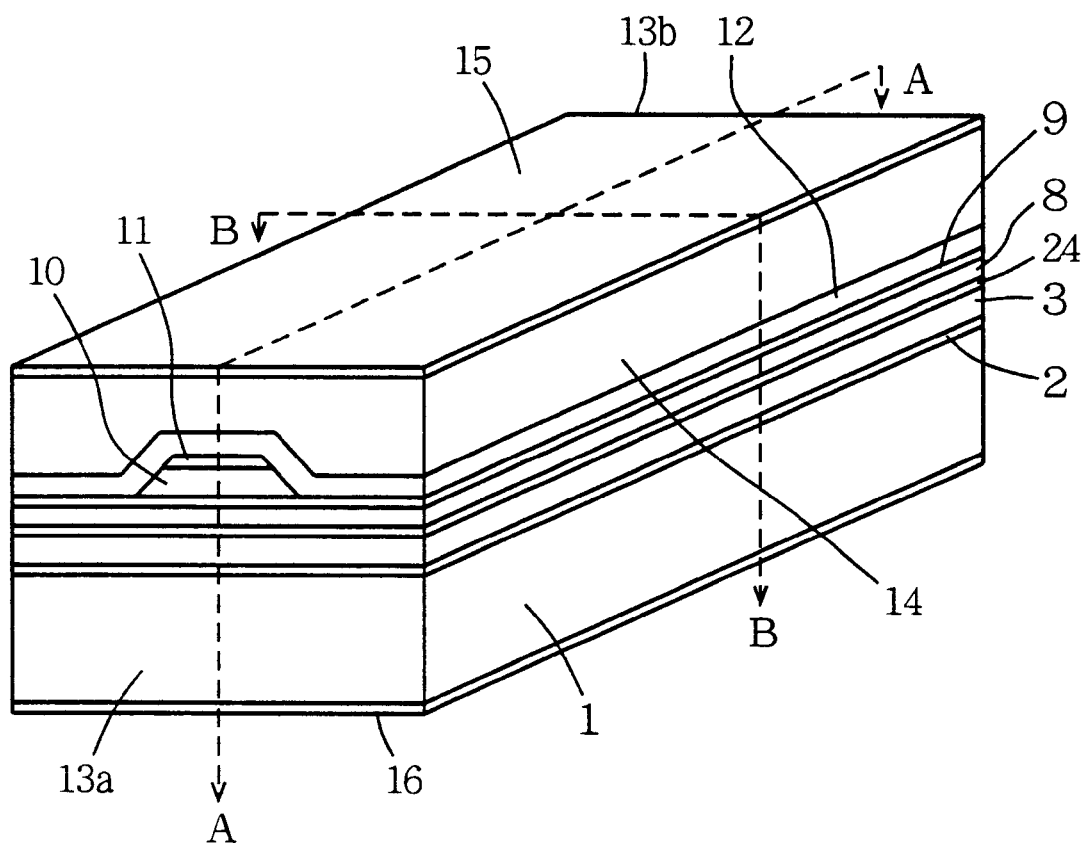
FIG. 9 is a schematic perspective view of a semiconductor laser device according to a second embodiment of the present invention.

An AlGaInP system semiconductor laser device according to a second embodiment of the present invention will be described with reference to the drawings. FIG. 9 is a schematic perspective view of the semiconductor laser device according to the second embodiment, FIG. 10 is a schematic cross-sectional view taken along a broken line A—A in FIG. 9, FIG. 11 is a schematic cross-sectional view taken along a broken line B—B in FIGS. 9 and 10, and FIG. 12 is a diagram showing a schematic band structure in the vicinity of an active layer of the semiconductor laser device.

The semiconductor laser device according to the second embodiment differs from the semiconductor laser device according to the first embodiment in that the active layer 4 in the first embodiment is replaced with an active layer 24 having a single quantum well structure. Therefore, the same reference numerals are assigned the same portions as those in the first embodiment and hence, the description thereof is not repeated.

Figure 10:
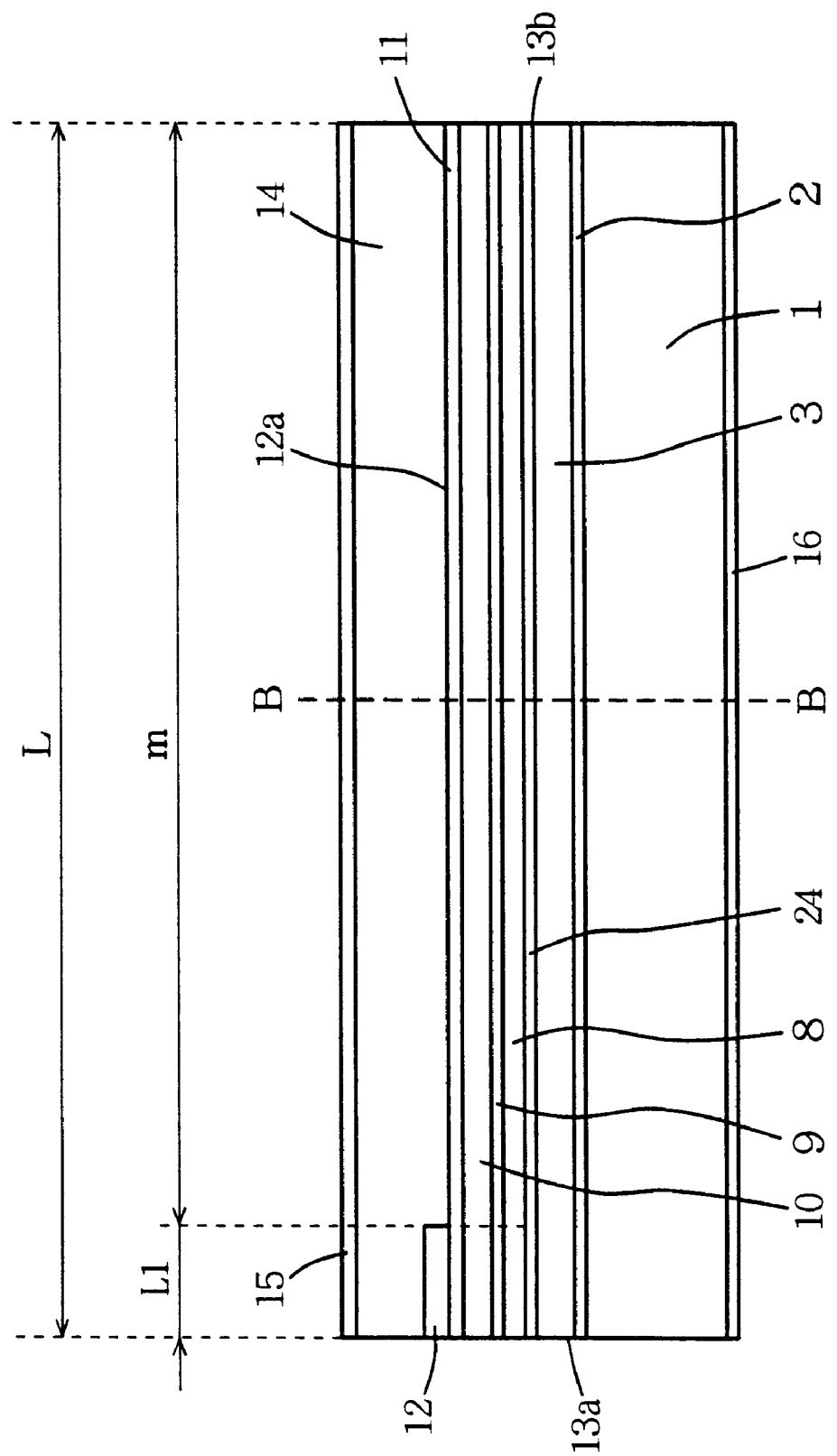
FIG. 10 is a schematic cross-sectional view take along a line A—A of the semiconductor laser device according to the second embodiment.
Figure 11:
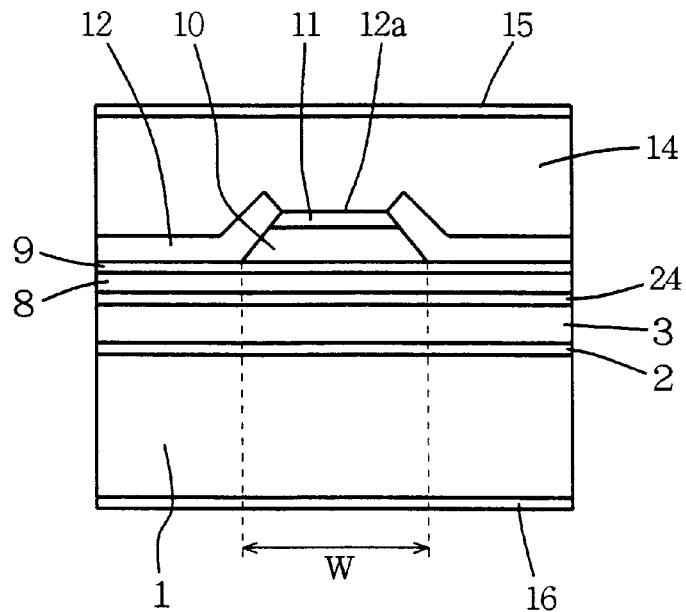
FIG. 11 is a schematic cross-sectional view taken along a line B—B of the semiconductor laser device according to the second embodiment.
Figure 12:
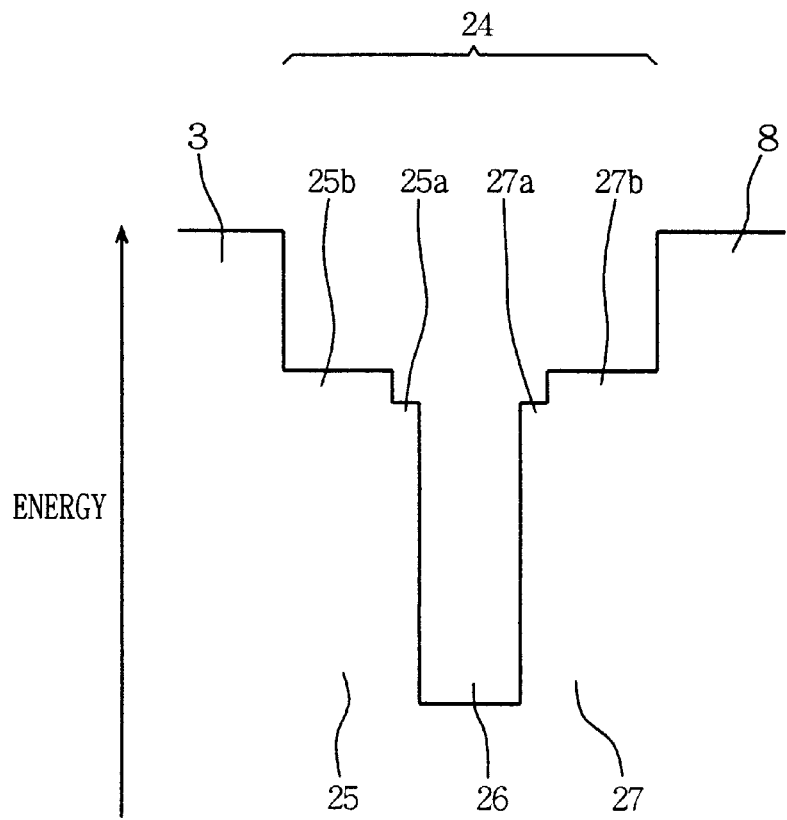
FIG. 12 is a diagram showing a schematic band structure in the vicinity of an active layer of the semiconductor laser device according to the second embodiment.

In FIGS. 9 to 11, an undoped active layer 24 is formed on an n-type cladding layer 3. As shown in detail in FIG. 12, the active layer 24 has a structure in which an optical guide layer 25, a single quantum well structure 26 and an optical guide layer 27 are stacked in this order.

The optical guide layer 25 is composed of undoped $(Al_{x2}Ga_{1-x2})_{y2}In_{1-y2}P$ having a thickness of 500 Å. In the present embodiment, x2=0.5. In the optical guide layer 25, y2=0.44 is selected in a region 25a having a thickness of 100 Å on the side of the single quantum well structure 26 in close contact with the structure 26, whereby the region 25a has compressive strain. On the other hand, in the optical guide layer 25, y2=0.5 is selected in a region 25b having a thickness of 400 Å on the side of the n-type cladding layer 3, whereby the region 25b has no strain.

The single quantum well structure 26 is composed of only $(Al_pGa_{1-p})_qIn_{1-q}P$ having a thickness of 250 Å which has tensile strain, where $1>p \geq 0$ and $1>q>0.51$. In the present embodiment, p=0 and q=0.67.

The optical guide layer 27 is composed of undoped $(Al_{x2}Ga_{1-x2})_{y2}In_{1-y2}P$ having a thickness of 500 Å. In the present embodiment, x2=0.5. In the optical guide layer 27, y2=0.44 is selected in a region 27a having a thickness of 40 Å on the side of the single quantum well structure 26 in close contact with the structure 26, whereby the region 27a has compressive strain. On the other hand, in the optical guide layer 27, y2=0.5 is selected in a region 27b having a thickness of 460 Å on the side of a p-type cladding layer 8, whereby the region 27b has no strain.

The semiconductor laser device is constructed similarly to the semiconductor laser device in the first embodiment except for the structure of the active layer. In the semiconductor laser device, therefore, a current blocking layer 12 is formed on a region on the upper surface of a ridge portion 10 from a facet 13a, which outputs main laser light, of a cavity to a position at a predetermined distance L therefrom. Accordingly, a region of the active layer 24 below the current blocking layer 12 is a current injection blocking region into which current is blocked from being injected. The current blocking layer 12 is not formed on a region on the upper surface of the ridge portion 10 at a distance m from the above-mentioned position at the predetermined distance L1 to the other facet 13b of the cavity. Accordingly, the active layer 24 below the region is a current injection region into which current is sufficiently injected. That is, the semiconductor laser device according to the present embodiment has a current injection blocking structure in the vicinity of one of facets of the cavity.

In the present embodiment, the total volume of quantum well layer 26a having a width W directly below the stripe-shaped ridge portion 10 is $7.5 \times 10^{-17}$ m$^3$.

The following Table 2 shows threshold current and maximum light output power in each of the semiconductor laser devices in the second embodiment 2 and a comparative example 4. The semiconductor laser device in the comparative example 4 is constructed similarly to the semiconductor laser device in the second embodiment except that the above-mentioned facet vicinity current injection region is not provided. The cavity length L is 600 μm. A coating having reflectivity of 5% is applied to the facet 13a of the cavity, and a coating having reflectivity of 95% is applied to the facet 13b of the cavity.

TABLE 2

|  | threshold current (mA) | maximum light output power (mW) |
|---|---|---|
| embodiment | 38 ~ 40 | ~60 |
| comparative example 4 | 38 ~ 41 | ~55 |

As can be seen from Table 2, in the semiconductor laser device in the comparative example 4 comprising an active layer having a single quantum well structure, the maximum light output power can be increased, and the threshold current can be decreased, as compared with those in the semiconductor laser device in the comparative example 3 comprising an active layer having a multi quantum well structure. That is, the formation of the active layer in the single quantum well structure is significantly effective in increasing the maximum light output power and decreasing the threshold current.

On the other hand, in the semiconductor laser device in the second embodiment, the threshold current is approximately the same, and the maximum light output power can be increased, as compared with those in the semiconductor laser device in the comparative example 4. This shows that in the case where the active layer has a single quantum well structure, the threshold current can be decreased, and the maximum light output power can be significantly increased by introducing the facet vicinity current injection blocking structure, as compared with those in the case where the active layer has a multi quantum well structure.

Moreover, the semiconductor laser device in the second embodiment has a longer life than those of the semiconductor laser devices in the comparative example 3 and the comparative example 4.

Figure 13:
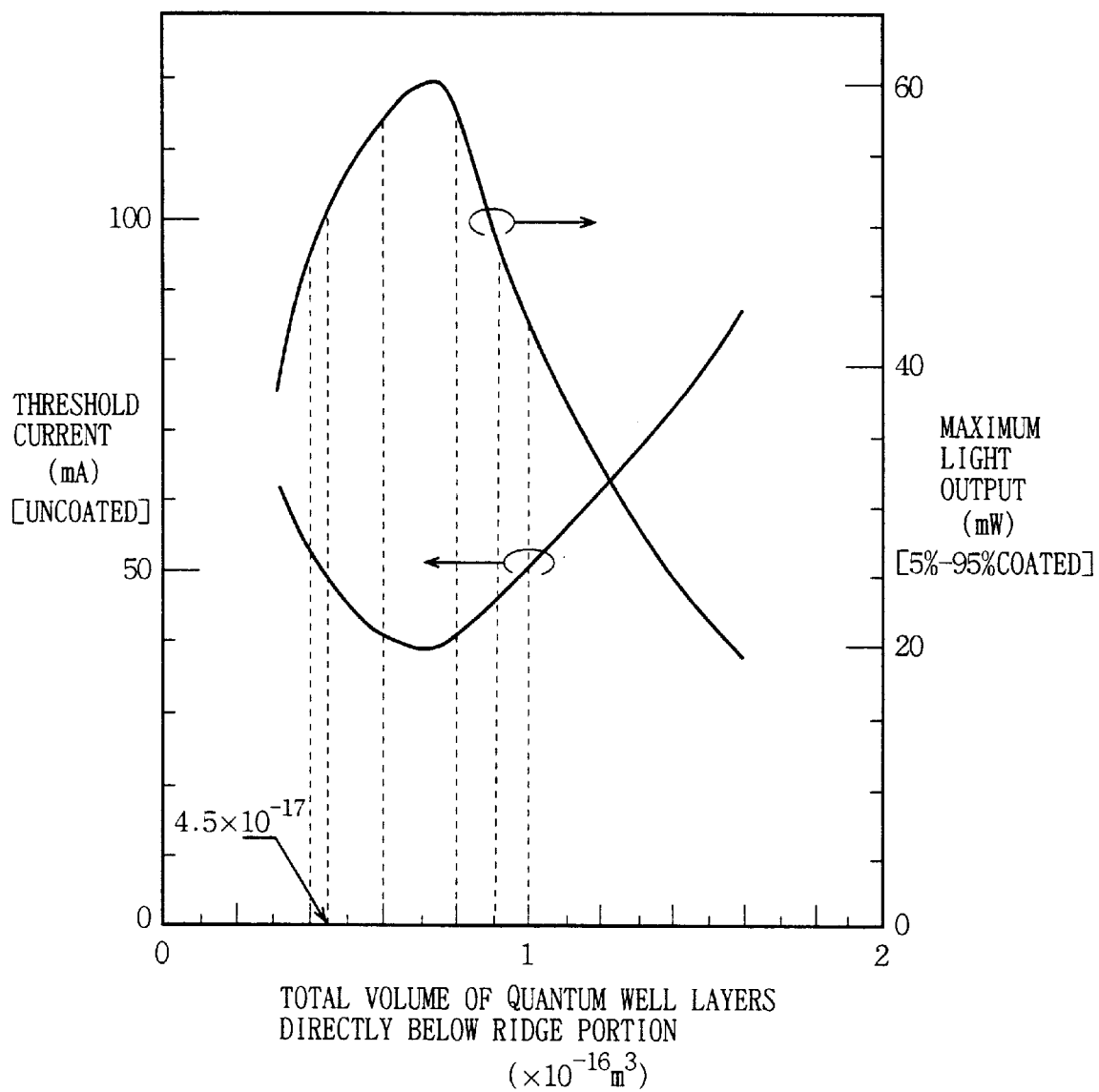
FIG. 13 is a diagram showing the relationship between the total volume of quantum well layers directly below a stripe-shaped ridge portion, threshold current, and maximum light output power.

The relationship between the total volume of the quantum well layers having a width W directly below the ridge portion 10 on the active layer 4 having the facet vicinity current injection blocking structure in the first embodiment, the threshold current, and the maximum light output power is shown in FIG. 13. The maximum light output power is measured in a semiconductor laser device in which the reflectivity of a front facet coating of a cavity is 5% and the reflectivity of a rear facet coating of the cavity is 95%, and the threshold current is measured in a semiconductor laser device in which both facets of a cavity are uncoated.

As can be seen from FIG. 13, the total volume of the quantum well layers directly below the ridge portion 10 is preferably not more than approximately $1 \times 10^{-16}$ m$^3$, more preferably not more than approximately $9 \times 10^{-17}$ m$^3$, and still more preferably not more than approximately $8 \times 10^{-17}$ m$^3$.

If the total volume of the quantum well layers directly below the ridge portion 10 is too small, the characteristics of the threshold current and the maximum light output power are degraded, whereby it is preferably not less than approximately $4 \times 10^{-17}$ m$^3$, more preferably not less than approximately $4.5 \times 10^{-17}$ m$^3$, and still more preferably not less than approximately $6 \times 10^{-17}$ m$^3$ nor more than approximately $8 \times 10^{-17}$ m$^3$.

A reliability test of the semiconductor laser devices in the second embodiment and the comparative example 4 is carried out. In this test, the reflectivity of the front facet coating of the cavity is taken as 5%, the reflectivity of the rear facet coating of the cavity is taken as 95%, the cavity length L is taken as 600 μm, and the light output power is taken as 30 mW, to measure the change in an operating current at a temperature of 50° C.

Figure 14:
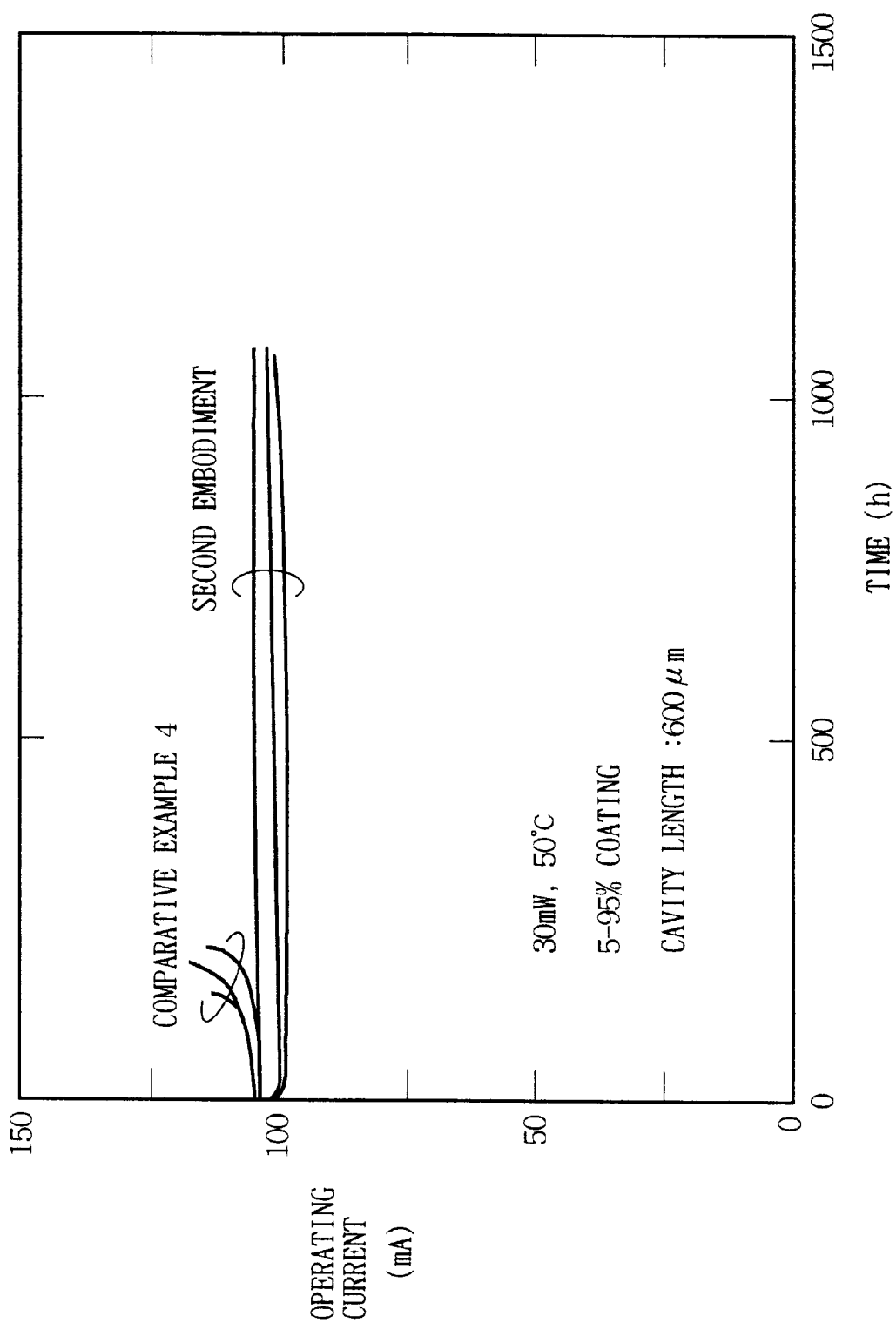
FIG. 14 is a diagram showing the results of a reliability test.

As shown in FIG. 14, in the semiconductor laser device in the comparative example 4, the operating current is raised beyond 100 hours. On the other hand, in the semiconductor laser device in the second embodiment 2, the operating current is hardly raised even beyond 1000 hours. It is thus found that the semiconductor laser device in the second embodiment has a longer life than the semiconductor laser device in the comparative example 4.

Although description was made of an example in which the distance L1 is 20 μm, approximately the same superior characteristics are obtained when the distance L1 is 20 to 30 μm, and a good effect is also obtained if it is in the range of approximately 10 to approximately 40 μm.

Although description was made of a case where the active layer has the strain compensation type quantum well structure, the active layer may have a quantum well structure having tensile strain or compressive strain, or may have a quantum well structure having no strain. However, it is preferable that the active layer has the strain compensation type quantum well structure in order that the threshold current is low and the maximum light output power is high in a short wavelength region, and the life of the semiconductor laser device is long.

Furthermore, the n-type $Ga_{0.5}In_{0.5}P$ buffer layer 2 provided between the n-type GaAs semiconductor substrate 1 and the n-type cladding layer 3 may be replaced with an n-type GaAs buffer layer. Alternatively, no buffer layer may be provided. A structure in which the etching stop layer 9 is not used can be also realized.

Furthermore, although in each of the above-mentioned embodiments, the current injection blocking structure is provided in the vicinity of one of the facets of the cavity, the current injection blocking structure may be provided in the vicinity of both the facets of the cavity.

Although $(Al_xGa_{1-x})_yIn_{1-y}P$ ($x \geq 0$) crystals are accurately in lattice matching with the GaAs semiconductor substrate when y=0.51 and cause no strain, they cause almost no strain if the composition ratio y of $(Al_xGa_{1-x})_yIn_{1-y}P$ is in the vicinity of 0.51. Accordingly, in crystals abbreviated as $(Al_xGa_{1-x})_{0.5}In_{0.5}P$ or y=0.5, for example, a value of 0.51 or its vicinity is sufficient as the composition ratio y of $(Al_xGa_{1-x})_yIn_{1-y}P$. Particularly in the present invention, it is preferable that the cladding layer and the current blocking layer have almost no strain.

Furthermore, although in each of the above-mentioned embodiments, the GaAs semiconductor substrate 1 has one main surface (crystal growth plane) misoriented from the (100) surface to the [011] direction, it is desirable that the GaAs semiconductor substrate has one main surface (crystal growth plane) in an equivalent relation therewith. Specifically, one main surface (crystal growth plane) of the GaAs semiconductor substrate may be a plane misoriented from the (100) surface to the [$0\overline{1}\overline{1}$] direction, a plane misoriented from the (010) surface to the [101] or [$\overline{1}0\overline{1}$] direction, or a plane misoriented from the (001) surface to the [110] or [$\overline{1}\overline{1}0$] direction, that is, a plane misoriented from the {100} plane to the <011>direction.

Although description was made of the semiconductor laser device having the stripe-shaped ridge portion, the present invention is applicable to a semiconductor laser device comprising a current blocking layer having a stripe-shaped opening, for example, a self-alignment type semiconductor laser device. Further, although description was made of the AlGaInP type semiconductor laser device, the present invention is also applicable to a semiconductor device of another material system, for example, an AlGaAs system, GaInAsP system, GaInAs system, ZnMgSSe system and AlInGaN system semiconductor laser devices.

Figure 15:
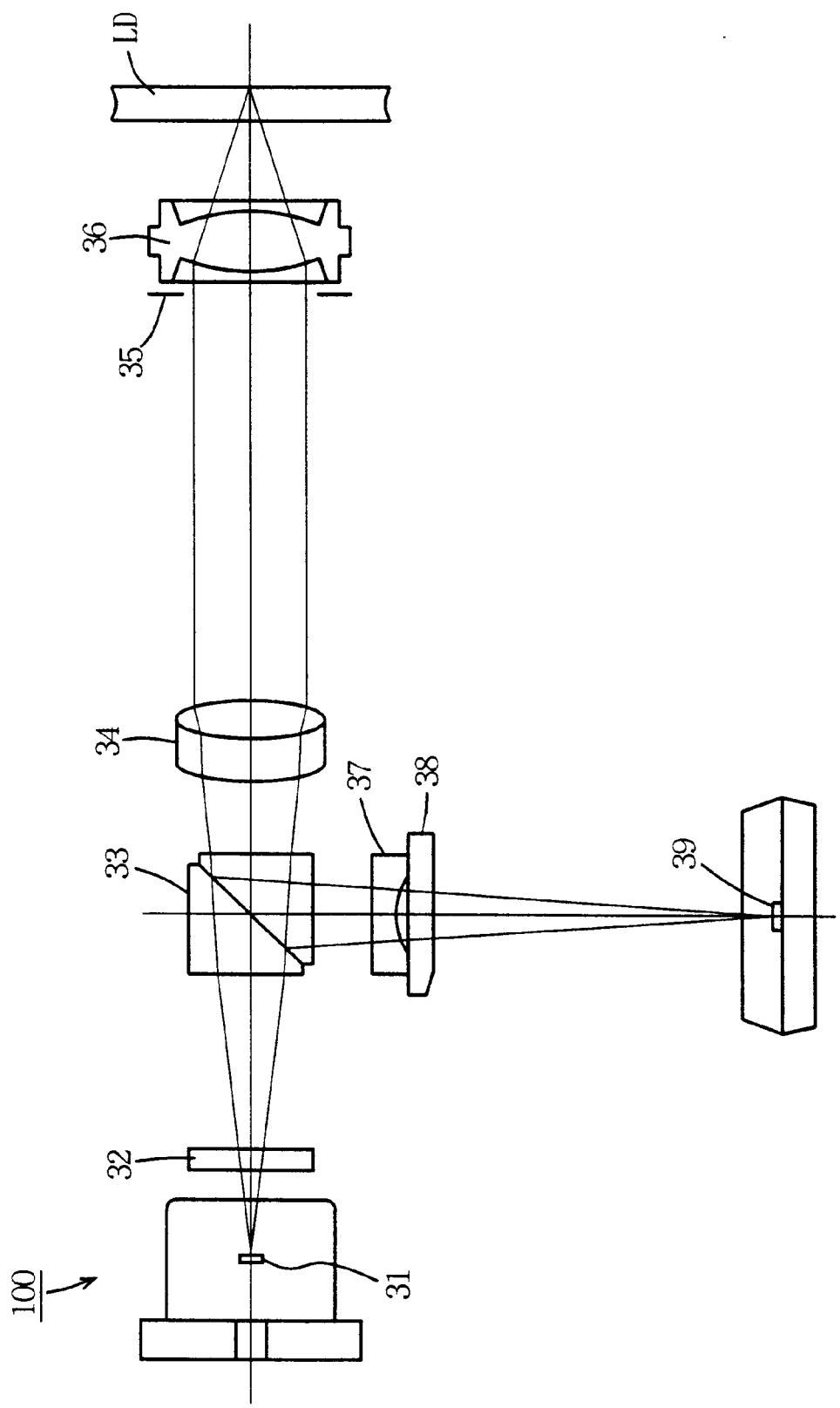
FIG. 15 is a schematic view showing an optical pickup using the semiconductor laser device according to the present invention.

FIG. 15 is a schematic view of an optical pickup 100 m using the semiconductor laser device according to the present invention. In FIG. 15, laser light emitted from a semiconductor laser device 31 passes through a diffraction grating 32, a beam splitter 33, and a collimator lens 34, and is converged on the surface of an optical disk LD by an objective lens 36 having an aperture stop 35. Returned light from the optical disk LD passes through the objective lens 36 and the collimator lens 34, is reflected by the beam splitter 33, and is incident on a photodiode 39 through a concave lens 37 and a cylindrical lens 38.

FIG. 16 is a block diagram showing the construction of an optical recording medium drive 200 using the optical pickup 100 shown in FIG. 15. The optical recording medium drive 200 shown in FIG. 16 is an optical disk drive for reading information from an optical disk LD.

The optical recording medium drive 200 comprises an optical pickup 100, a motor 101, a rotation control system 102, a coarse motor 103, a coarse motor control system 104, a pickup control system 105, a signal processing system 106, and a drive controller 107.

The motor 101 rotates the optical disk LD at a predetermined speed. The rotation control system 102 controls a rotating operation of the motor 101. The coarse motor 103 moves the optical pickup 100 along the radius of the optical disk LD. The coarse motor control system 104 controls operations performed by the coarse motor 103. The optical pickup 100 irradiates laser light onto the optical disk LD, and receives returned light from the optical disk LD. The pickup control system 105 controls a projecting and receiving operation of the optical pickup 100.

The signal processing system 106 calculates a reproduction signal, a focus error signal and a tracking error signal upon receipt of an output signal from a photodiode 39 in the optical pickup 100, and feeds the reproduction signal to the drive controller 107, while feeding the focus error signal and the tracking error signal to the pickup control system 105. The drive controller 107 controls the rotation control system 102, the coarse motor control system 104, the pickup control system 105 and the signal processing system 106 in conformity to a command given through a drive interface 108, and outputs the reproduction signal through the drive interface 108.

In the optical recording medium drive shown in FIG. 16, the semiconductor laser device according to the present invention is used, whereby reliable and high-density recording and reproduction of information are possible with low power consumption, and the life of products is lengthened.

The semiconductor laser device of the present invention can be used for optical pickups having different structures from the optical pickup shown in FIG. 15 and optical recording medium drives having different structures from the optical recording medium drive shown in FIG. 16.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device comprising in the order listed:
   a cladding layer of a first conductivity type;
   an active layer having a quantum well structure including one or a plurality of quantum well layers; and
   a cladding layer of a second conductivity type opposite to said first conductivity type,
   said cladding layer of the first conductivity type, said active layer, and said cladding layer of the second conductivity type constituting a cavity, and
   said active layer having a current injection blocking structure for blocking the injection of current on a region on the side of one of facets of the cavity, emitting a main laser beam, and having no current injection blocking structure on the side of the other facets of the cavity.

2. The semiconductor laser device according to claim 1, wherein
   said current injection blocking structure comprises
   a current blocking layer formed on said cladding layer of the second conductivity type and having a stripe-shaped opening for injecting current,
   said stripe-shaped opening being arranged along the cavity length direction from a position at a predetermined distance from one of the facets of the cavity.

3. The semiconductor laser device according to claim 2, wherein
   said cladding layer of the second conductivity type comprises a flat portion formed on said active layer and a stripe-shaped ridge portion on said flat portion, and
   said current blocking layer is formed on said flat portion so as to cover the side surface of said ridge portion and formed on a region on the upper surface of said ridge portion from one of said facets of the cavity to the position at said predetermined distance therefrom.

4. The semiconductor laser device according to claim 3, wherein
   the total volume of said quantum well layer or layers directly below said stripe-shaped ridge portion is not more than approximately $1 \times 10^{-16}$ m$^3$.

5. The semiconductor laser device according to claim 4, wherein
   the total volume of said quantum well layer or layers directly below said stripe-shaped ridge portion is not more than approximately $9 \times 10^{-17}$ m$^3$.

6. The semiconductor laser device according to claim 5, wherein
   the total volume of said quantum well layer or layers directly below said stripe-shaped ridge portion is not more than approximately $8 \times 10^{-17}$ m$^3$.

7. The semiconductor laser device according to claim 3, wherein
   the total volume of said quantum well layer or layers directly below said stripe-shaped ridge portion is not less than approximately $4 \times 10^{-17}$ m$^3$.

8. The semiconductor laser device according to claim 7, wherein
   the total volume of said quantum well layer or layers directly below said stripe-shaped ridge portion is not less than approximately $4.5 \times 10^{-17}$ m$^3$.

9. The semiconductor laser device according to claim 8, wherein
   the total volume of said quantum well layer or layers directly below said stripe-shaped ridge portion is not less than approximately $6 \times 10^{-17}$ m$^3$.

10. The semiconductor laser device according to claim 3, wherein
    the total volume of said quantum well layer or layers directly below said stripe-shaped ridge portion is not less than approximately $4 \times 10^{-17}$ m$^3$ nor more than approximately $1 \times 10^{-16}$ m$^3$.

11. The semiconductor laser device according to claim 3, wherein
    the total volume of said quantum well layer or layers directly below said stripe-shaped ridge portion is not less than approximately $4.5 \times 10^{-17}$ m$^3$ nor more than approximately $9 \times 10^{-17}$ m$^3$.

12. The semiconductor laser device according to claim 3, wherein
    the total volume of said quantum well layer or layers directly below said stripe-shaped ridge portion is not less than approximately $6 \times 10^{-17}$ m$^3$ nor more than approximately $8 \times 10^{-17}$ m$^3$.

13. The semiconductor laser device according to claim 2, wherein
    said predetermined distance from one of said facets of the cavity is not less than approximately 10 $\mu$m nor more than approximately 40 $\mu$m.

14. The semiconductor laser device according to claim 13, wherein
    said predetermined distance from one of said facets of the cavity is not less than approximately 20 $\mu$m nor more than approximately 30 $\mu$m.

15. The semiconductor laser device according to claim 1, wherein
    said cladding layers of the first conductivity type and the second conductivity type are composed of $(Al_{x1}Ga_{1-x1})_{y1}In_{1-y1}P$, and said quantum well layer is composed of $(Al_pGa_{1-p})_qIn_{1-q}P$, where $1 \geq x1 > 0$, $1 > y1 > 0$, $x1 > p \geq 0$, and $1 > q > 0$.

16. The semiconductor laser device according to claim 1, wherein said quantum well structure is a multi quantum well structure constructed by alternately stacking a plurality of quantum well layers and a plurality of barrier layers.

17. The semiconductor laser device according to claim 16, wherein said plurality of quantum well layers in said multi quantum well structure have tensile strain, and said plurality of barrier layers therein have compressive strain.

18. The semiconductor laser device according to claim 16, wherein said cladding layers of the first conductivity type and the second conductivity type are composed of $(Al_{x1}Ga_{1-x1})_{y1}In_{1-y1}P$, said plurality of quantum well layers are composed of $(Al_pGa_{1-p})_qIn_{1-q}P$, and said plurality of barrier layers are composed of $(Al_rGa_{1-r})_sIn_{1-s}P$, where $1 \geq x1 > 0$, $1 > y1 > 0$, $x1 > p > 0$, $1 > q > 0$, $1 \geq r > p > 0$, and $1 > s > 0$.

19. The semiconductor laser device according to claim 1, wherein said quantum well structure is a single quantum well structure.

20. The semiconductor laser device according to claim 19, wherein said quantum well layer in said single quantum well structure has tensile strain.

21. The semiconductor laser device according to claim 19, wherein said cladding layers of the first conductivity type and the second conductivity type are composed of $(Al_{x1}Ga_{1-x1})_{y1}In_{1-y1}P$, and said quantum well layer is composed of $(Al_pGa_{1-p})_qIn_{1-q}P$, where $1 \geq x1 > 0$, $1 > y1 > 0$, $x1 > p \geq 0$, and $1 > q > 0$.

22. The semiconductor laser device according to claim 1, wherein said active layer further comprises optical guide layers provided on both surfaces of said quantum well structure, and said quantum well layer has tensile strain, and at least a region, on the side of said quantum well structure, of each of the optical guide layers has compressive strain.

23. The semiconductor laser device according to claim 22, wherein said cladding layers of the first conductivity type and the second conductivity type are composed of $(Al_{x1}Ga_{1-x1})_{y1}In_{1-y1}P$, and said optical guide layers are composed of $(Al_{x2}Ga_{1-x2})_{y2}In_{1-y2}P$, where $1 \geq x1 > 0$, $1 > y1 > 0$, $x1 > x2 > 0$, and $1 > y2 > 0$.

24. An optical recording medium drive comprising:

a rotation driving portion for rotating an optical recording medium;

an optical pickup comprising a semiconductor laser device and a photo detector for irradiating laser light emitted from said semiconductor laser device onto said optical recording medium and receiving returned light from said optical recording medium by said photo detector;

a pickup driving portion for moving said optical pickup along the radius of said optical recording medium; and a signal processing portion for processing an output signal from said photo detector in said optical pickup, said semiconductor laser device comprising in the order listed:

a cladding layer of a first conductivity type;

an active layer comprising a quantum well structure including one or a plurality of quantum well layers; and a cladding layer of a second conductivity type opposite to said first conductivity type, said cladding layer of the first conductivity type, said active layer, and said cladding layer of the second conductivity type constituting a cavity, and said active layer having a current injection blocking structure for blocking the injection of current on a region on the side of one of facets of the cavity, emitting a main laser beam, and having no current injection blocking structure on the side of the other facets of the cavity.

25. The optical recording medium drive according to claim 24, wherein said current injection blocking structure comprises a current blocking layer formed on said cladding layer of the second conductivity type and having a stripe-shaped opening for injecting current, said stripe-shaped opening being arranged along the cavity length direction from a position at a predetermined distance from at least one of the facets of the cavity.

26. The optical recording medium drive according to claim 25, wherein said cladding layer of the second conductivity type comprises a flat portion formed on said active layer and a stripe-shaped ridge portion on said flat portion, and said current blocking layer is formed on said flat portion so as to cover the side surface of said ridge portion and formed on a region on the upper surface of said ridge portion from at least one of said facets of the cavity to the position at said predetermined distance therefrom.

27. The optical recording medium drive according to claim 24, wherein said cladding layers of the first conductivity type and the second conductivity type are composed of $(Al_{x1}Ga_{1-x1})_{y1}In_{1-y1}P$, and said quantum well layer is composed of $(Al_pGa_{1-p})_qIn_{1-q}P$, where $1 \geq x1 > 0$, $1 > y1 > 0$, $x1 > p \geq 0$, and $1 > q > 0$.

28. The optical recording medium drive according to claim 24, wherein said quantum well structure is a multi quantum well structure constructed by alternately stacking a plurality of quantum well layers and a plurality of barrier layers.

29. The optical recording medium drive according to claim 28, wherein said plurality of quantum well layers in said multi quantum well structure have tensile strain, and said plurality of barrier layers therein have compressive strain.

30. The optical recording medium drive according to claim 24, wherein said quantum well structure is a single quantum well structure.

31. The semiconductor laser device according to claim 30, wherein
said quantum well layer in said single quantum well structure has tensile strain.

32. The optical recording medium drive according to claim 24, wherein
said active layer further comprises optical guide layers provided on both surfaces of said quantum well structure, and
said quantum well layer has tensile strain, and at least a region, on the side of said quantum well structure, of each of the optical guide layers has compressive strain.

33. A semiconductor laser device comprising in the order listed:
a cladding layer of a first conductivity type;
an active layer having a single quantum well structure including one or a plurality of quantum well layers;
a cladding layer of a second conductivity type opposite to said first conductivity type, having a flat portion formed on said active layer and a stripe-shaped ridge portion on said flat portion, said cladding layer of the first conductivity type, said active layer, and said cladding layer of the second conductivity type constituting a cavity; and
a current injection blocking structure for blocking the injection of current on a region on a side of one of facets of the cavity, having a current blocking layer formed on said flat portion so as to cover the side surface of said ridge portion and formed on a region on the upper surface of said ridge portion from one of said facets of the cavity to a position at a predetermined distance therefrom, and a stripe-shaped opening for injecting current being arranged along the cavity length direction starting from the position at said predetermined distance from one of the facets of the cavity,
wherein a total volume of said quantum well layer or layers directly below said stripe-shaped ridge portion is not more than approximately $1 \times 10^{-16}$ m$^3$ and not less than approximately $4 \times 10^{-17}$ m$^3$.

34. The semiconductor laser device according to claim 33, wherein the total volume of said quantum well layer or layers directly below said stripe-shaped ridge portion is not more than approximately $9 \times 10^{-17}$ m$^3$.

35. The semiconductor laser device according to claim 34, wherein the total volume of said quantum well layer or layers directly below said stripe-shaped ridge portion is not more than approximately $8 \times 10^{-17}$ m$^3$.

36. The semiconductor laser device according to claim 33, wherein the total volume of said quantum well layer or layers directly below said stripe-shaped ridge portion is not less than approximately $4 \times 10^{-17}$ m$^3$.

37. The semiconductor laser device according to claim 36, wherein the total volume of said quantum well layer or layers directly below said stripe-shaped ridge portion is not less than approximately $4.5 \times 10^{-17}$ m$^3$.

38. The semiconductor laser device according to claim 37, wherein the total volume of said quantum well layer or layers directly below said stripe-shaped ridge portion is not less than approximately $6 \times 10^{-17}$ m$^3$.

39. The semiconductor laser device according to claim 33, wherein the total volume of said quantum well layer or layers directly below said stripe-shaped ridge portion is not less than approximately $4 \times 10^{-17}$ m$^3$ nor more than approximately $1 \times 10^{-16}$ m$^3$.

40. The semiconductor laser device according to claim 33, wherein the total volume of said quantum well layer or layers directly below said stripe-shaped ridge portion is not less than approximately $4.5 \times 10^{-17}$ m$^3$ nor more than approximately $9 \times 10^{-17}$ m$^3$.

41. The semiconductor laser device according to claim 33, wherein the total volume of said stripe-shaped ridge portion is not less than approximately $6 \times 10^{-17}$ m$^3$ nor more than approximately $8 \times 10^{-17}$ m$^3$.

42. The semiconductor laser device according to claim 33, wherein said predetermined distance from at least one of said facets of the cavity is not less than approximately 10 μm nor more than approximately 40 μm.

43. The semiconductor laser device according to claim 42, wherein said predetermined distance from at least one of said facets of the cavity is not less than approximately 20 μm nor more than approximately 30 μm.

44. The semiconductor laser device according to claim 33, wherein said cladding layers of the first conductivity type and the second conductivity type are composed of $(Al_{x1}Ga_{1-x1})_{y1}In_{1-y1}P$, and
said quantum well layer is composed of $(Al_pGa_{1-p})_qIn_{1-q}P$,
wherein $1 \geq x1 > 0$, $1 > y1 > 0$, $x1 > p \geq 0$, and $1 > q > 0$.

45. The semiconductor laser device according to claim 33, wherein said quantum well layer in said single quantum well structure has tensile strain.

46. The semiconductor laser device according to claim 33, wherein
said active layer further comprises optical guide layers provided on both surfaces of said quantum well structure, and
said quantum well layer has tensile strain, and at least a region, on the side of said quantum well structure, of each of the optical guide layers have compressive strain.

47. The semiconductor laser device according to claim 46, wherein said cladding layers of the first conductivity type and the second conductivity type are composed of $(Al_{x1}Ga_{1-x1})_{y1}In_{1-y1}P$, and
said quantum well layer is composed of $(Al_pGa_{1-p})_qIn_{1-q}P$,
wherein $1 \geq x1 > 0$, $1 > y1 > 0$, $x1 > p \geq 0$, and $1 > q > 0$.

* * * * *